United States Patent [19]

Amerasekera et al.

[11] Patent Number: 5,793,083
[45] Date of Patent: Aug. 11, 1998

[54] METHOD FOR DESIGNING SHALLOW JUNCTION, SALICIDED NMOS TRANSISTORS WITH DECREASED ELECTROSTATIC DISCHARGE SENSITIVITY

[75] Inventors: E. Ajith Amerasekera, Plano; Vincent M. McNeil, Dallas; Mark S. Rodder, University Park, all of Tex.

[73] Assignee: Texas Instruments Incorporated, Dallas, Tex.

[21] Appl. No.: 755,924

[22] Filed: Nov. 25, 1996

[51] Int. Cl.$^6$ ............................................. H01L 23/62
[52] U.S. Cl. ........................ 257/355; 257/384; 257/382; 257/413; 257/408; 438/236; 438/234; 438/289; 438/649
[58] Field of Search ............................. 257/408, 412, 257/413, 382, 383, 384, 355; 437/917, 909, 913, 193, 200, 201; 438/217, 236, 234, 289, 649

[56] References Cited

U.S. PATENT DOCUMENTS 4,442,591  4/1984  Haken ................................ 29/571
4,769,686  9/1988  Horiuchi et al. ...................... 257/373
5,141,890  8/1992  Haken ................................ 257/336

OTHER PUBLICATIONS

Ting et al., Silicide for Contacts and Interconnects, IEDM, 1984, pp. 110–113.

Leung et al., "Refractory Metal Silicide/N$^+$ Polysilicon in CMOS/SOS," IEEE •IEDM Technical Digest, 1980, pp. 827–830.

*Primary Examiner*—William Mintel
*Attorney, Agent, or Firm*—William W. Holloway; Wade James Brady, III; Richard L. Donaldson

[57] ABSTRACT

A technique for providing a design window for scaled technologies in which good electrostatic discharge/electrical over stress damage and optimum transistor operation can be achieved without the use of additional masks or design steps. The M, beta, and $R_{sub}$ parameters of the NMOS transistor 13 and associated parasitic npn transistor 10 are selected to provide the design window.

17 Claims, 4 Drawing Sheets

METHOD FOR DESIGNING SHALLOW JUNCTION, SALICIDED NMOS TRANSISTORS WITH DECREASED ELECTROSTATIC DISCHARGE SENSITIVITY

BACKGROUND OF THE INVENTION

1. Field of the Invention

This invention relates generally to the fabrication of integrated circuit transistors and, more particularly, to the design of scaled technology integrated circuits having optimum transistor reliability and operational characteristics.

2. Description of the Related Art

In scaling toward the sub-0.25 um technologies, and even smaller scales, shallower drain source junction devices are desirable for transistor performance because of reduced short-channel effects. The salicide thickness, required for low gate and active sheet resistance, is one of the parameters defining the junction depth. However, shallower junctions and thicker salicides have a negative impact on the electrostatic discharge capability of a device. Furthermore, circuits designed in these technologies are more sensitive to electrostatic discharge (ESD) and electrical overstress (EOS) damage. Solutions to these problems in deep submicron technologies have used additional process steps which either block the salicide in the electrostatic discharge circuits and output circuits, or use an extra implant process step to make the junction deeper. Increasing the junction depth improves the electrostatic discharge performance, however, the mechanisms are not well understood making it difficult to optimize for transistor performance as well as electrostatic discharge performance. A lateral transistor portion of the NMOS transistor provides the main current path for the electrostatic discharge currents in both the device and in the electrostatic discharge protection circuit associated with the device.

One major obstacle to understanding the effects of drain engineering on the electrostatic discharge performance is the problem of determining the beta of the self-biased lateral transistor under high current conditions (>1 mA/um of width). DC measurements show this beta to be less than 0.1, a value which is inconsistent with a beta of approximately 5 when obtained under pulsed conditions from device simulations.

A need has therefore been felt for a technique for defining a design window for the fabrication of scaled NMOS transistors in which the electrostatic discharge/electrical overstress performance is improved and the transistor properties optimized. In order to accomplish this design window definition, a technique for determining beta must be developed.

SUMMARY OF THE INVENTION

The aforementioned and other features are accomplished, according to the present invention, by a technique for directly extracting the lateral transistor beta. A correlation between this beta and the second breakdown trigger current $I_{t2}$ is demonstrated. The relationship between the junction depths and salicide thickness, which affect the lateral transistor current gain beta, is developed. Beta is shown to be related to the second breakdown trigger current $I_{t2}$ and can be used as the electrostatic discharge monitor. Beta is strongly influenced by the effective drain/source dopant diffusion level $X_{jeff}$ below the salicide layer. The dopant diffusion level $X_{jeff}$ is determined using implant energy as well as the amount of active diffusion occurring in the salicidation, the salicidation being defined by the salicide thickness. Based on these results, a design window for electrostatic discharge and transistor performance can be identified. The design window does not require additional process steps and the impact on the transistor performance can be identified.

These and other features of the present invention will be understood upon the reading of the following description in conjunction with the Figures.

DESCRIPTION OF THE PREFERRED EMBODIMENT(s)

1. DETAILED DESCRIPTION OF THE DRAWINGS

Figure 1:
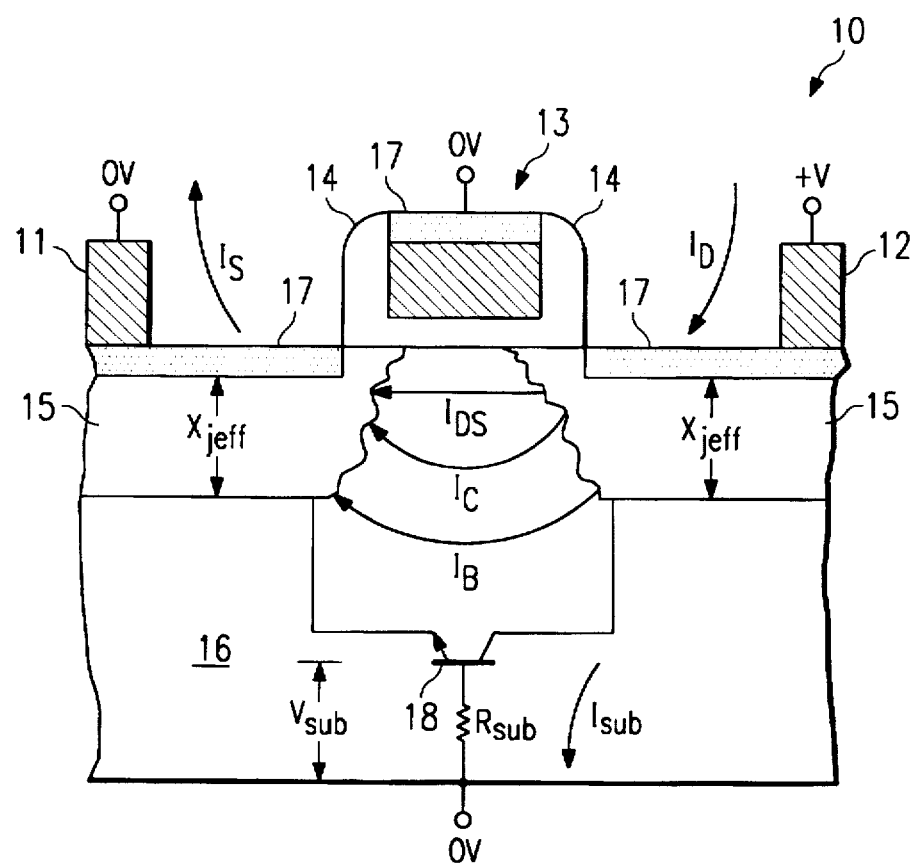
FIG. 1 across-sectional view of a salicided NMOS transistor.

Referring to FIG. 1, a cross-sectional view of a salicided NMOS transistor 10 illustrating the current flow in both the transistor and in the parasitic lateral npn transistor 18 is shown. The transistor 10 is formed on a p-substrate. The p-substrate 16 is separated from the surface salicide layer 17 by n-region 15 which has an effective depth of $X_{jeff}$. Drain (collector) terminal 12 has a potential V applied thereto and receives a current $I_D$. The source (emitter) terminal 11 has 0 volts applied thereto and transmits a current of $I_s$. The gate terminal 13, which includes a surface salicide region 17, has 0 volts applied thereto. A current $I_{DS}$ flows from the drain terminal to the source terminal.

The transistor 10 of FIG. 1 can further be considered as having an equivalent parasitic lateral NPN transistor 18. The p-substrate 16 has 0 volts applied thereto. A current of $I_{sub}$ flows through the base of the lateral NPN transistor and through an equivalent resistor $R_{sub}$. The base of the lateral NPN transistor is shown as being at $V_{sub}$ potential.

Figure 2:
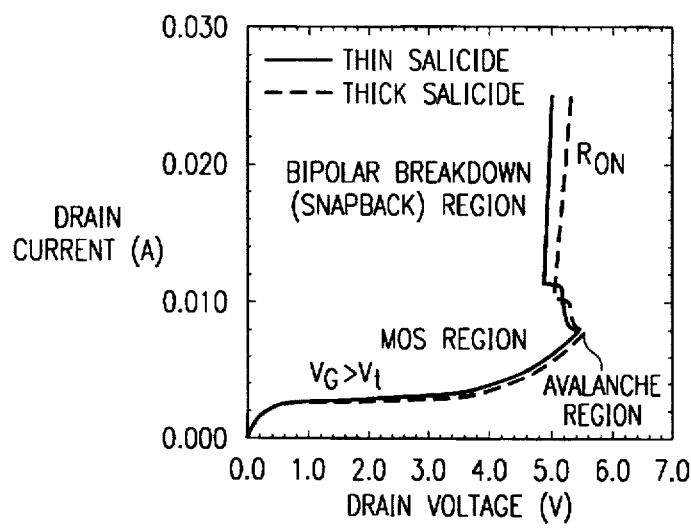
FIG. 2 shows e relationship between drain current and the the drain voltage of a NMOS transistor for two different salicide thicknesses.

Referring to FIG. 2, the I–V curve of an 0.29 um gate length NMOS transistor having a gate bias of VG <Vt, for two different salicide thicknesses, is shown. The avalanche region, and the bipolar breakdown or snapback region are shown. The on-resistance $R_{on}$ in the snapback region is higher for the thicker salicide device.

Figure 3:
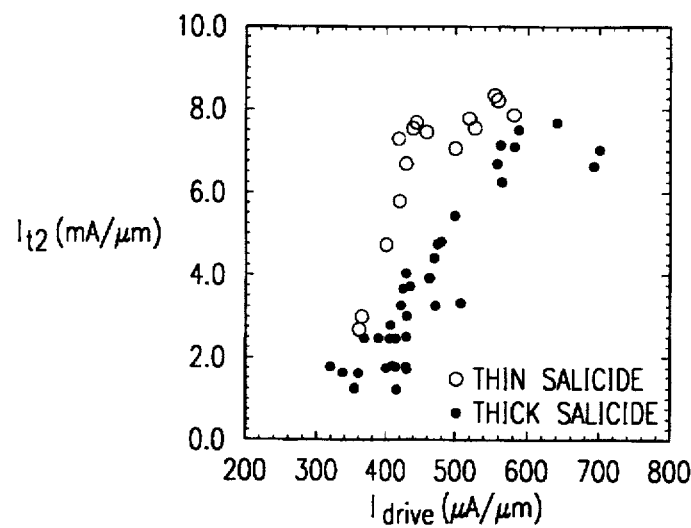
FIG. 3 is an experimentally derived relationship between the second breakdown trigger current $I_{t2}$ and the drive current $I_{dr}$ for thick and thin salicide devices.

Referring to FIG. 3, the high second breakdown trigger current $I_{t2}$ is shown as a function of drive current $I_{dr}$ for thick and thin salicide devices. The drive current $I_{dr}$ is a measure of the effective channel length (or base width of the lateral NPN transistor) with the lower $I_{dr}$ indicating a longer effective channel length.

Figure 4:
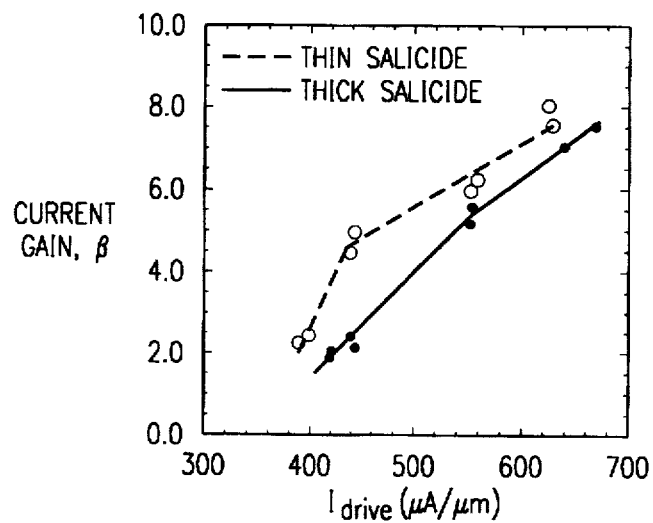
FIG. 4 is an experimentally derived relationship between the beta of the lateral npn transistor and the drive current $I_{dr}$ for different salicide thicknesses.

Referring to FIG. 4, the current gain beta of the lateral NPN transistor as a function of the drive current $I_{dr}$ is shown for different salicide thicknesses. The lower drive current $I_{dr}$ corresponds to a longer base width for the lateral NPN transistor and therefore shows a lower beta. The relationship is influenced by the salicide thickness.

Figure 5:
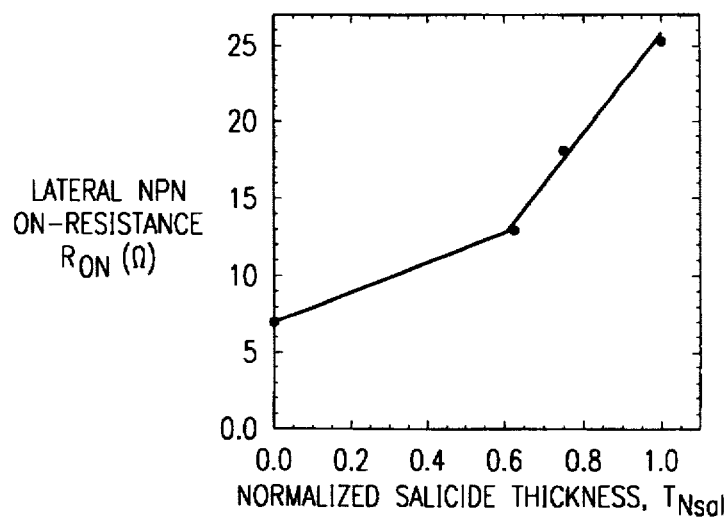
FIG. 5 is an experimentally derived relationship between the lateral npn on-resistance $R_{ON}$ and the normalized salicide thickness.

Referring to FIG. 5, the lateral NPN on-resistance $R_{ON}$ is shown as a function of normalized salicide thickness $T_{Nsal}$. $T_{Nsal}=1$ is the maximum salicide thickness tested, while $T_{Nsal}=0$ is a process without the salicide step.

Figure 6:
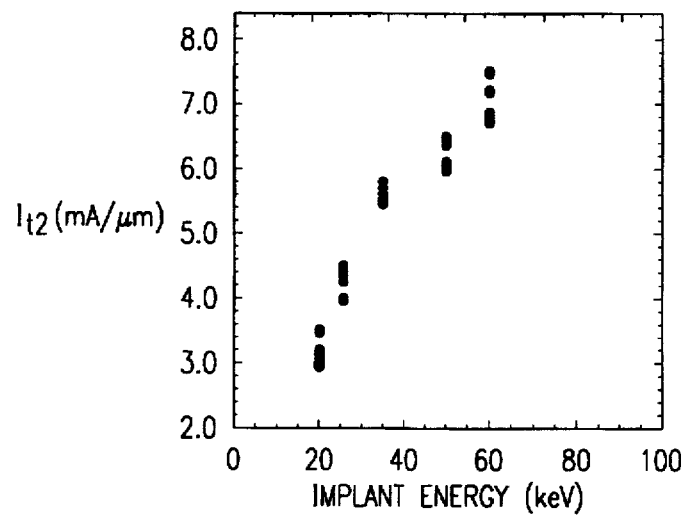
FIG. 6 is an experimentally derived relationship between the second breakdown trigger current $I_{t2}$ and the sourcedrain arsenic implant energy.

Referring to FIG. 6, the second breakdown trigger current $I_{t2}$ as a function of source-drain arsenic implant energy (through bare silicon)is shown. The amount of arsenic and the salicide thickness were held constant. Higher implant energies correspond to deeper junctions.

Figure 7:
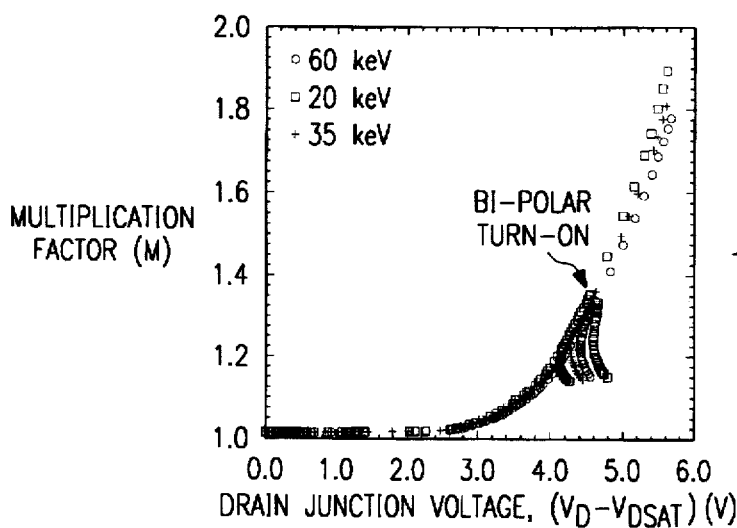
FIG. 7 shows the dependence of the multiplication factor M for the drain-substrate avalanching as a function of effective drain junction voltage $\{V_D-V_D(SAT)\}$.

Referring to FIG. 7, the dependence of the multiplication factor M for the drain-substrate avalanching as a function of the effective drain junction voltage $\{V_D-V_D(SAT)\}$ is shown. When the bipolar transistor is turned on, the multiplication factor M decreases as shown in FIG. 7. No dependence on the profile of the implant energy is found. Note that higher M requires a higher junction voltage.

Figure 8:
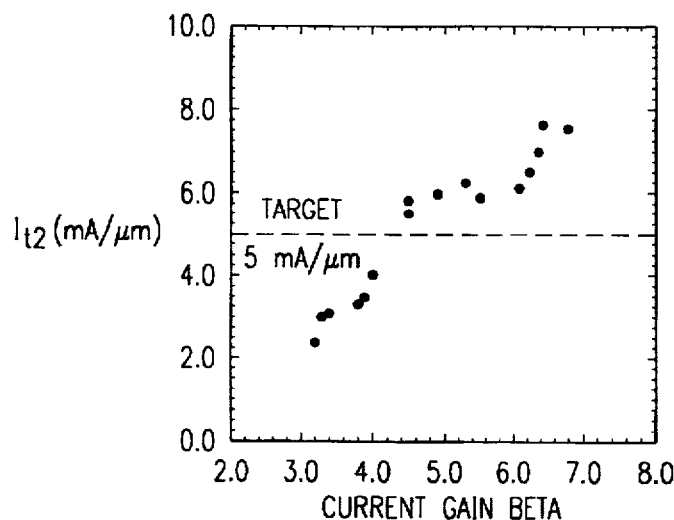
FIG. 8 shows the correlation between the second breakdown trigger current $I_{t2}$ and the beta as a function of energy.

Referring to FIG. 8, the correlation between the second breakdown trigger current $I_{t2}$ and the current gain beta is shown for different implant energies. The target second breakdown trigger current for good electrostatic discharge performance is 5 mA/um.

Figure 9:
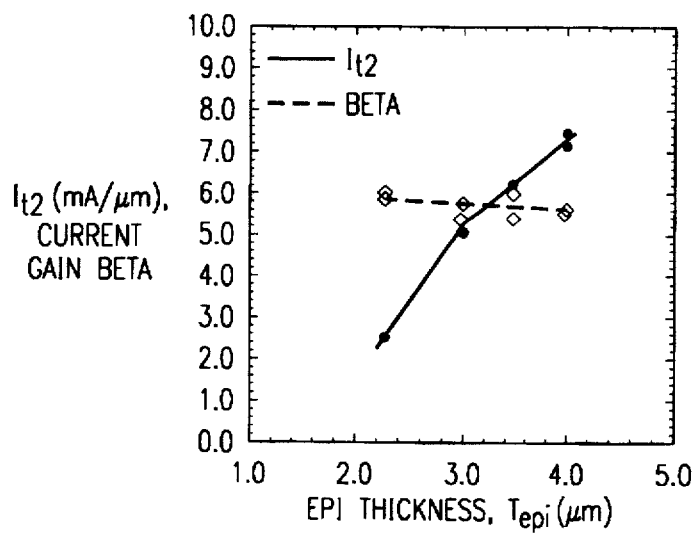
FIG. 9 shows the effect of epitaxial deposition thickness on the second breakdown trigger current $I_{t2}$ and the multiplication factor beta.

Referring to FIG. 9, the effect of the epitaxial thickness on the second breakdown trigger current $I_{t2}$ and on the current gain beta of the lateral NPN transistor for L=0.29 um is shown. Thinner epitaxial deposition decreases $I_{t2}$, but the change in current gain beta is insignificant. The current gain beta even increases a little because the direction of the electric field in the epitaxial-substrate interface would aid the flow of electrons to the collector.

Figure 10:
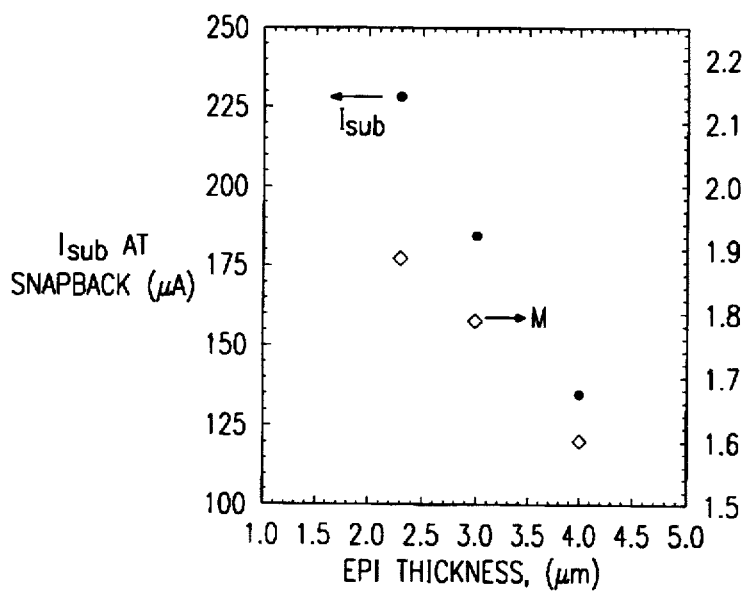
FIG. 10 shows the variation of the substrate current $I_{sub}$ and the multiplication factor beta as a function of epitaxial deposition layer thickness.

Referring to FIG. 10, the variation of the substrate current $I_{sub}$ and the multiplication factor M, at snapback, is shown as a function of epitaxial deposition thickness. The thinner epitaxial layer has a lower strate resistance $R_{sub}$ which requires a higher strate current $I_{sub}$ and hence a larger multiplication factor M to turn on the lateral NPN transistor.

2. Operation of the Preferred Embodiment(s)

When the drain current $I_D$ in the NMOS transistor 10 is high enough that avalanche-generated hole current $I_{gen}$ can bias the lateral NPN transistor, the device goes into bipolar breakdown or snapback as shown in FIG. 2. The terminal drain current $I_D$ is then given by the equation:

$$I_D=M(I_{DS}+I_c), \tag{1}$$

wherein $I_{DS}$ is the NMOS transistor current, $I_c$ is the bipolar current and M is the multiplication factor obtained from the equation:

$$M=I_D/(I_D-I_{sub}) \tag{2}$$

in the region before the snapback phenomenon and wherein $I_{sub}$ is the terminal substrate current. M is a function both of the drain voltage $V_D$ and the drain saturation voltage $V_D$ (SAT). Because the base current is given by the equation:

$$I_B=(I_{gen}-I_{sub}) \tag{3}$$

and wherein $I_{gen}$ is given by the equation:

$$I_{gen}=I_D(M-1)/M, \tag{4}$$

beta is given by the equation:

$$beta=(I_D/M-I_{DS})/\{I_D(M-1)/M-I_{sub}\}. \tag{5}$$

All the parameters are obtained from a DC I-V measurement as shown in FIG. 2. Beta is measured at $I_D=1mA/um$.

The experimental results were obtained on fully salicided 0.25 um technologies with gate oxides that are approximately 5 nm thick. The second breakdown trigger current $I_{t2}$ is strongly dependent on the effective channel length which is inversely proportional to the drive current $I_{dr}$ (cf. FIG. 3), with a decrease in $I_{t2}$ observed at lower $I_{dr}$, i.e., longer gate lengths. A plot of beta as a function of $I_{dr}$ (FIG. 4) indicates a similar trend.

A number of process variations were evaluated. A first group of transistors were provided with salicide thickness nearly half that of the standard transistor devices. The thinner salicide devices were able to sustain a longer channel length before the $I_{t2}$ rolloff occurred. The beta correlates well with the $I_{t2}$ the critical beta for $I_{t2}$ rolloff being between 4 and 5. The drain-source $R_{SD}$ for the thinner salicide layers was lower than for the thicker salicide layers. Therefore, the drain ballasting during the second breakdown is not the reason for the improved $I_{t2}$. The on-resistance $R_{ON}$ of the lateral NPN transistor with the thinner salicide is lower than for the thicker salicide layer (FIG. 2). This effect is seen when comparing the salicided and the non-salicided processes, even though the salicided contact resistance can be lower, and indicates that the lateral NPN transistor efficiency is important for $R_{ON}$ (FIG. 5). In the second batch of transistors, the arsenic drain implant energy was varied between 20 keV and 60 keV through bare silicon. Referring to FIG. 6, $I_{t2}$ increases with higher implant energy. The resistance $R_{SD}$ does not change significantly for the different implant energies. FIG. 7 shows M as a function of effective junction voltage $\{V_{D-VD}(SAT)\}$ for all evaluated implant energies. As expected, little variation is found in the M profiles for different implant energies. FIG. 8 shows that $I_{t2}$ is correlated with the beta of the self-biased lateral NPN transistor. A stable $I_{t2}$ is observed for beta between 5 and 6, and $I_{t2}$ decreases rapidly as beta falls below 5. The effect of the epitaxial thickness, and hence the $_{sub}$ strate resistance $R_{sub}$ on $I_{t2}$ and beta shows that the thinner epitaxial layer reduces $I_{t2}$ for the longer channel devices, but that beta does not change significantly (FIG. 9). However, M increases with the thinner epitaxial layer as did $I_{sub}$ (FIG. 10). Therefore, the lower $I_{t2}$ is due to the lower $R_{sub}$ which required a higher $I_{sub}$ to provide the $_{sub}$ strate voltage needed to turn-on the lateral NPN transistor. Hence, $I_{gen}$ is higher and M must increase.

The foregoing results indicate that the key factor in influencing the behavior of NMOS transistors is the lateral NPN transistor's beta, a quantity which can also serve as an indicator of high current robustness for the lateral NPN transistor with a given $R_{sub}$. A critical level of beta is observed to be about 5, with a sharp decrease in $I_{t2}$ as beta falls below 5. $I_{t2}$ was also reduced by lower $R_{sub}$. The mechanism which determines $I_{t2}$ is joule heating at the reverse-biased drain $_{sub}$ strate junction. A reduction in beta or in $R_{sub}$, which increases M, will cause higher joule heating and a lower $I_{t2}$. Therefore, shallower junctions and thicker salicides will degrade the electrostatic discharge performance. By using the values of M, beta, and $R_{sub}$, a design window in scaled technologies can be defined for good electrostatic discharge/electrical overstress performance and optimum transistor operation without the use of additional masks or process steps.

The procedure of the present invention can be summarized in the following manner. The second breakdown trigger current, $I_{t2}$, is one of the quantities determining the acceptability of an NMOS transistor to meet the electrostatic discharge (EDS) and electrical overstress (EOS) requirements. The second breakdown trigger current $I_{t2}$ has been found to be a function of the electrical parameters of the multiplication factor M, the strate resistance $R_{sub}$, and beta. When the second breakdown current $I_{t2}$ is not high enough, one of the three electrical parameters can be increased. The electrical parameters can be increased by changing physical properties of the NMOS device. When M and $R_{sub}$ are held constant, $I_{t2}$ can be increased by increasing beta. Beta can be increased by increasing the junction depth $X_{jeff}$, by reducing the salicide thickness or by decreasing the channel length. When beta and M are fixed, the second breakdown trigger current can be increased by increasing $R_{sub}$, a parameter proportional to the epitaxial layer thickness and doping concentration. When beta and $R_{sub}$ are fixed, the second breakdown trigger current can be increased by increasing M which is a function of the junction doping. For a second breakdown trigger current $I_{t2}$ of 5mA/micron, beta should be 3 or greater, M should be 1.5 or greater, and $R_{sub}$ should be 200 Ohms or greater.

While the invention has been described with particular reference to the preferred embodiment, it will be understood by those skilled in the art that various changes may be made and equivalents substituted for elements of the preferred embodiment without departing from the invention. For example, the present invention has been described with particular reference to a variable pulse width for an address transition signal. However, the technique for insuring that an address signal with a varying pulse width can be processed in such a manner as to have a constant output pulse width can have wider application. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. In an NMOS transistor, a method for providing an electrical overstress and electrostatic discharge monitor parameter greater than a preselected value, said method comprising the steps of:

providing a value for a junction multiplication factor M parameter greater than or equal to a first established value at a voltage close to an "on" voltage of a parasitic lateral transistor formed during fabrication of said NMOS transistor;

providing a value for a beta parameter of said parasitic lateral bipolar transistor greater than or equal to a second established value;

providing a value for the substrate resistance parameter $R_{sub}$ greater than or equal to a third established value, said established values of said M, beta, and $R_{sub}$ parameters resulting in a transistor breakdown current at least as large as said preselected value.

2. The method of claim 1 wherein said monitor parameter is said transistor breakdown current.

3. The method of claim 1 further comprising the step of: when an established value of one of said M, beta, and $R_{sub}$ parameters is less than said established value for said parameter and said transistor breakdown current is less than said predetermined value, increasing a value of at least one of the remaining two parameter values to provide a transistor breakdown current greater than said predetermined value.

4. The method of claim 1 wherein said M parameter value is determined by processes for fabricating said NMOS transistor, the method further comprising the step of increasing at least one of said beta parameter value and said $R_{sub}$ parameter value when said transistor breakdown current is below said predetermined value.

5. The method of claim 4 wherein said beta parameter is increased by a process step selected from the group of process steps consisting of:

increasing an effective junction depth $X_{jeff}$;

reducing a salicide thickness; and decreasing the effective channel length of the NMOS transistor.

6. The method of claim 4 wherein said $R_{sub}$ parameter value is increased by at least one of the steps of:

increasing a thickness of an epitaxial layer; and reducing a doping concentration of an epitaxial layer.

7. The method of claim 3 wherein parameter M can be increased by at least one of the steps of:

increasing a junction doping for said NMOS transistor and, increasing doping in a vicinity of said junction of at least one of a well and a substrate.

8. The method of claim 2 further comprising the step of:

selecting said predetermined transistor breakdown current to approximately 5 ma/micron(width).

9. The method of claim 8 further comprising the steps of:

selecting said established value of said M parameter to be approximately 1.5 at a drain voltage approximately equal to an on voltage of said lateral bipolar transistor;

selecting said established value of said $R_{sub}$ parameter to be approximately 200 Ohms; and selecting said established value of said beta parameter to be approximately 5.

10. An NMOS transistor requiring a transistor breakdown trigger current greater than or equal to 5 mA/micron(width), said transistor comprising:

an NMOS transistor having a junction multiplication factor M value greater than or equal to approximately 1.5; and a parasitic lateral npn transistor formed when said NMOS transistor is fabricated, said lateral npn transistor having a beta parameter value greater than or equal to 3, said lateral npn transistor having a $sub$ strate resistance parameter value greater than or equal to approximately 200 Ohms, wherein said multiplication factor value M greater than or equal to approximately 1.5 occurs at a drain voltage approximately equal to an "on" voltage of said lateral transistor.

11. The transistor of claim 10 wherein, when said breakdown trigger current is below a minimum transistor breakdown current, increasing at least one of said parameter values to increase said breakdown trigger current.

12. A method for providing an NMOS transistor having a transistor breakdown current greater than or equal to a predetermined value, said transistor breakdown current monitors electrical overstress of said transistor, said method comprising the steps of:

measuring said transistor breakdown current; and when said transistor breakdown current is less than said predetermined value, increasing a value of at least one of an M parameter, a beta parameter, and a substrate resistance value until said transistor breakdown current is greater than said predetermined value.

13. The method of claim 12 wherein said beta parameter is increased by a process step selected from the group of process steps consisting of:

increasing an effective junction depth $X_{jeff}$;

reducing a salicide thickness; and decreasing the effective channel length of the NMOS transistor.

14. The method of claim 12 wherein said $R_{sub}$ parameter value is increased by at least one of the steps including:

increasing a thickness of an epitaxial layer; and reducing a doping concentration of said epitaxial layer.

15. The method of claim 12 wherein parameter M can be increased by at least one of the steps of:

increasing a junction doping for said NMOS transistor and, increasing a doping level in a vicinity of said junction of at least one of a well and a substrate.

16. The method of claim 12 further comprising the step of:

selecting said predetermined transistor breakdown current to be approximately 5 ma/micron(width).

17. The method of claim 16 further comprising the steps of:

selecting said established value of said M parameter to be approximately 1.5 at a drain voltage approximately equal to an on voltage of said lateral bipolar transistor;

selecting said established value of said $R_{sub}$ parameter to be approximately 200 Ohms; and selecting said established value of said beta parameter to be approximately 5.

\* \* \* \* \*